United States Patent
Wright et al.

(10) Patent No.: US 9,554,460 B2
(45) Date of Patent: Jan. 24, 2017

(54) REFLECTIVE CONDUCTIVE COMPOSITE FILM

(75) Inventors: Tina Wright, County Durham (GB); Xavier Bories-Azeau, Barcelona (ES)

(73) Assignee: Dupont Teijin Films U.S. Limited Partnership, Chester, VA (US)

( * ) Notice: Subject to any disclaimer, the term of this patent is extended or adjusted under 35 U.S.C. 154(b) by 807 days.

(21) Appl. No.: 13/884,506

(22) PCT Filed: Nov. 10, 2011

(86) PCT No.: PCT/GB2011/001589
§ 371 (c)(1),
(2), (4) Date: Sep. 25, 2013

(87) PCT Pub. No.: WO2012/063024
PCT Pub. Date: May 18, 2012

(65) Prior Publication Data
US 2014/0008106 A1  Jan. 9, 2014

(30) Foreign Application Priority Data
Nov. 12, 2010 (GB) .................................. 1019212.8

(51) Int. Cl.
| | | |
|---|---|---|
| B05D 5/12 | (2006.01) | |
| H05K 1/02 | (2006.01) | |
| B32B 27/20 | (2006.01) | |
| B32B 27/36 | (2006.01) | |
| H01B 1/22 | (2006.01) | |
| H01B 13/00 | (2006.01) | |
| B05D 3/02 | (2006.01) | |
| B05D 1/26 | (2006.01) | |
| C23C 18/12 | (2006.01) | |
| B05D 5/06 | (2006.01) | |

(52) U.S. Cl.
CPC ............. H05K 1/0274 (2013.01); B32B 27/20 (2013.01); B32B 27/36 (2013.01); H01B 1/22 (2013.01); H01B 13/0036 (2013.01); B05D 1/265 (2013.01); B05D 3/02 (2013.01); B05D 5/063 (2013.01); B32B 2307/202 (2013.01); B32B 2307/416 (2013.01); B32B 2457/12 (2013.01); B32B 2457/14 (2013.01); B32B 2457/202 (2013.01); C23C 18/1262 (2013.01)

(58) Field of Classification Search
USPC .......................................... 427/58, 122, 125
See application file for complete search history.

(56) References Cited

U.S. PATENT DOCUMENTS

| | | | |
|---|---|---|---|
| 5,348,589 A | 9/1994 | Arai et al. | |
| 5,504,133 A | 4/1996 | Murouchi et al. | |
| 5,882,798 A | 3/1999 | Hubbard et al. | |
| 5,908,585 A | 6/1999 | Shibuta | |
| 5,925,428 A | 7/1999 | Hubbard et al. | |
| 6,061,977 A | 5/2000 | Toyama et al. | |
| 6,184,280 B1 | 2/2001 | Shibuta | |
| 6,416,818 B1 | 7/2002 | Aikens et al. | |
| 6,548,832 B1 | 4/2003 | Sakamoto et al. | |
| 6,583,919 B1 | 6/2003 | Mizutani et al. | |
| 6,613,603 B1 | 9/2003 | Sano | |
| 6,777,477 B1 | 8/2004 | Niume et al. | |
| 6,784,462 B2 | 8/2004 | Schubert | |
| 6,927,818 B2 | 8/2005 | Hinata et al. | |
| 8,049,333 B2 * | 11/2011 | Alden ........................... 257/741 |
| 8,197,931 B2 | 6/2012 | Ueda | |
| 8,749,009 B2 * | 6/2014 | Young ................. H01L 31/0481 136/243 |
| 8,852,689 B2 * | 10/2014 | Srinivas ................. A01N 25/34 427/191 |
| 9,112,166 B2 * | 8/2015 | Gaynor .................. B82Y 20/00 |
| 2006/0257638 A1 * | 11/2006 | Glatkowski ............... C09D 5/24 428/292.1 |
| 2007/0065651 A1 | 3/2007 | Glatkowski | |
| 2007/0126959 A1 | 6/2007 | Eguchi et al. | |
| 2007/0145358 A1 | 6/2007 | Yasuda et al. | |
| 2008/0026204 A1 | 1/2008 | Tamai et al. | |
| 2009/0056854 A1 * | 3/2009 | Oh ........................ B32B 27/12 156/60 |
| 2009/0176121 A1 | 7/2009 | Mizuno | |
| 2010/0047522 A1 * | 2/2010 | Sivarajan ................. H01B 1/18 428/143 |
| 2010/0197068 A1 * | 8/2010 | Poon ................. H01L 31/02246 438/63 |
| 2010/0307792 A1 * | 12/2010 | Allemand ............. B82Y 10/00 174/126.1 |

* cited by examiner

FOREIGN PATENT DOCUMENTS

| | | | |
|---|---|---|---|
| EP | 0408197 A2 | | 1/1991 |
| GB | 0908300 | * | 6/2009 |
| JP | 08-199096 | | 8/1996 |
| JP | 09-109259 | | 4/1997 |
| JP | 2006519712 | | 8/2006 |
| JP | 2008126469 | | 6/2008 |
| WO | WO 2004/069736 A2 | | 8/2004 |
| WO | WO 2007/022226 A2 | | 2/2007 |
| WO | WO 2007/114645 | * | 10/2007 |
| WO | WO 2007/114645 A1 | | 10/2007 |
| WO | WO 2008/046058 A2 | | 4/2008 |
| WO | 2008093623 | | 8/2008 |
| WO | WO 2008/131304 A1 | | 10/2008 |
| WO | WO 2008/147431 A2 | | 12/2008 |
| WO | WO 2009/017852 A2 | | 2/2009 |
| WO | WO 2010/130986 | * | 11/2010 |

*Primary Examiner* — Brian K Talbot
(74) *Attorney, Agent, or Firm* — RatnerPrestia

(57) ABSTRACT

A process for the manufacture of a reflective conductive film comprising: (i) a reflective polymeric substrate comprising a polymeric base layer and a polymeric binding layer, wherein the polymeric material of the base layer has a softening temperature $T_{S-B}$, and the polymeric material of the binding layer has a softening temperature $T_{S-HS}$; and (ii) a conductive layer comprising a plurality of nanowires, wherein said nanowires are bound by the polymeric matrix of the binding layer such that the nanowires are dispersed at least partially in the polymeric matrix of the binding layer, said process comprising the steps of providing a reflective polymeric substrate comprising a polymeric base layer and a polymeric binding layer; disposing said nanowires on the exposed surface of the binding layer; and heating the composite film to a temperature $T_1$ wherein $T_1$ is equal to or greater than TS–HS, and $T_1$ is at least about 5° C. below $T_{S-B}$.

27 Claims, No Drawings

REFLECTIVE CONDUCTIVE COMPOSITE FILM

This application is a National Phase filing of International Application No. PCT/GB2011/001589, filed 10 Nov. 2011, which claims priority of GB Application No. 1019212.8, filed 12 Nov. 2010, the entireties of which applications are incorporated herein by reference for all purposes.

FIELD OF THE INVENTION

The present invention is concerned with a reflective conductive composite film, and an improved method for the manufacture thereof.

BACKGROUND OF THE INVENTION

There has been considerable research into the manufacture of transparent conductive films. Such films are generally multi-layer films which comprise a support which exhibits high light-transmittance and/or low haze (the degree to which light is scattered as it passes through a material), as well as high insulating properties, overlaid with a thin conductive layer containing an electro-conductive material. Such films must exhibit high surface conductivity while maintaining high optical transparency and have been used as transparent electrodes in the manufacture of photovoltaic cells, EMI shielding screens, flat liquid crystal displays, electroluminescent devices and touch screens in electronic equipment (for instance PDAs, mobile phones etc). Thin film photovoltaic (PV) cells are of particular interest and for this utility the support must exhibit high light transmittance. The support can be a glass, ceramic or polymeric substrate, and recent developments in flexible electronic devices have focussed on the use of polymeric substrates. Flexible substrates allow manufacture of conductive films in a low-cost, high throughput process. Transparent conductive films composite films have typically been produced by vacuum deposition or sputtering techniques. Wet-coating methods have also been used to prepare conductive films, by applying to a substrate a coating composition comprising conductive particles and typically also a binder resin, which is then dried (or sintered) at high-temperature to form a conductive layer, as disclosed in for example U.S. Pat. No. 5,504,133, JP-A-8-199096, JP-A-9-109259, U.S. Pat. No. 5,908,585, U.S. Pat. No. 6,416,818, U.S. Pat. No. 6,777,477, said dried layer may be then subsequently compressed as disclosed in for example in US-2007/0145358 and US-2008/0026204.

Typically, the conductive layer comprises a conductive metal oxide such as indium tin oxide (ITO). However, metal oxide films are fragile and prone to damage during bending or other physical stresses. They also require elevated deposition temperatures and/or high annealing temperatures to achieve high conductivity levels, and this can limits the applicability of vacuum deposition techniques in the manufacture of flexible electronic devices based on polymeric substrates. In addition, vacuum deposition is a costly process and requires specialized equipment, and is not conducive to forming patterns and circuits which typically results in the need for expensive patterning processes such as photolithography. Conductive polymers have also been used as electrical conductors, but these generally have lower conductivity values and higher optical absorption (particularly at visible wavelengths) compared to the metal oxide films, and can suffer from lack of chemical and long-term stability.

More recent developments have utilised nanowires for the preparation of transparent conductive layers. The nanowires must exhibit good adhesion to the substrate and good abrasion resistance. The preparation of transparent conductive layers is disclosed in WO-A-2007/022226, WO-A-2008/046058, WO-A-2008/131304, WO-A-2008/147431, WO-A-2009/017852, WO-A-2007/114645 and WO-A-2004/069736. Typically, the nanowires are applied onto a pre-formed substrate and form a surface conductive network. The nanowire network is then typically over-coated with one or more protective or barrier layer(s), such as an abrasion-resistant or binder layer (e.g. a UV-curable resin layer) in order to impart mechanical integrity or some other characteristic to the conductive layer, while allowing high light-transmittance. The network of metal nanowires becomes partially embedded in the over-coat matrix such that some nanowires may be entirely covered by the matrix while other nanowires may protrude above the surface. Surface conductivity is ensured if enough protruding nanowires percolate above the over-coat matrix.

Thus, the conventional production of transparent conductive films comprising nanowires involves three distinct stages: (i) the preparation of the substrate; (ii) subsequent off-line coating of the nanowires; and (iii) subsequent off-line coating of the protective over-coat layer. Typically, one or both of the off-line coating steps is effected using solvent-coating techniques. It would be desirable to provide a more efficient method of manufacture, for example one which dispenses with the over-coating step, while maintaining the mechanical integrity and abrasion resistance of the conductive layer. In addition, it would be desirable to avoid the use of potentially hazardous and environmentally unfriendly organic solvents in the manufacture of transparent conductive films.

It would also be desirable to provide a reflective conductive film, particularly a diffuse reflecting film. Such films can be used in applications which require a high reflectance and a high electrical conductivity. Such conductive and reflective films may be used as elements in solar cells, liquid crystal displays, electronic display devices (including electronic-paper (e-paper) and electrochromic displays), light irradiation devices (including light-emitting diode devices and semiconductor laser devices), decorative illumination devices, or any device which may require a reflecting electrode. Conductive films which act as diffuse reflecting layers in a variety of applications are disclosed in US-2009/0176121-A. A reflective conductive film is used as the rear electrode layer in a photovoltaic cell in U.S. Pat. No. 5,348,589. Photovoltaic devices containing a reflective conductive films are also disclosed in U.S. Pat. No. 6,061,977 and U.S. Pat. No. 6,613,603. A metal layer e.g. Al, Ag, Cu, Au and a conductive oxide layer e.g. ZnO (used to impart some roughness to the extremely smooth metal surface) are successively applied onto a substrate (such as stainless steel) used as a support for the photovoltaic device. The two layers are typically deposited by expensive physical coatings methods, e.g. magnetron sputtering, which are difficult to apply to large-scale roll-to-roll production.

Reflective conductive film is disclosed in U.S. Pat. No. 6,583,919 as a layer in an electrochromic anti-glare mirror, suitable for use in the automotive industry. Electrically conductive and pigmented (white or coloured) polymer compositions are disclosed in U.S. Pat. No. 6,184,280, which further describes the formation of electrically conductive filaments, films and other articles therefrom, which are reported for use as anti-static mats, shields for electromagnetic radiation, construction materials, and other applications requiring conductive members. US-2007/0126959 and U.S. Pat. No. 6,927,818 disclose reflective conductive film layers in transflective liquid crystal display devices. U.S. Pat. No. 6,548,832 and U.S. Pat. No. 6,784,462 teach the use of reflective conductive films to improve the efficiency of light extraction in light irradiation devices containing light-emitting elements such as light-emitting diodes or semiconductor lasers.

SUMMARY OF THE INVENTION

It is an object of the present invention to overcome the problems mentioned above. It is a particular object of the invention to provide an improved method of manufacture of reflective conductive films, particularly a diffuse reflective conductive film, which having the target electrical, optical and mechanical properties of conventional reflective conductive films, which can be manufactured in a more efficient and economic manner.

According to the present invention, there is provided a process for the manufacture of a reflective conductive film comprising:
(i) a reflective polymeric substrate comprising a polymeric base layer and a polymeric binding layer, wherein the polymeric material of the base layer has a softening temperature $T_{S-B}$, and the polymeric material of the binding layer has a softening temperature $T_{S-HS}$; and
(ii) a conductive layer comprising a plurality of nanowires, wherein said nanowires are bound by the polymeric matrix of the binding layer such that the nanowires are dispersed at least partially in the polymeric matrix of the binding layer, said process comprising the steps of providing a reflective polymeric substrate comprising a polymeric base layer and a polymeric binding layer; disposing said nanowires on the exposed surface of the binding layer, preferably by dispersing said nanowires in a liquid vehicle and coating said nanowire-containing liquid onto the exposed surface of the binding layer; and heating the composite film to a temperature $T_1$ wherein $T_1$ is equal to or greater than $T_{S-HS}$, and $T_1$ is at least about 5° C., preferably at least about 10° C., preferably at least about 20° C., preferably at least about 30° C., and preferably at least about 50° C., below $T_{S-B}$.

The present invention offers highly valuable improvements on the existing manufacturing process. The process of the present invention provides greatly improved efficiency and significant economic benefits to the manufacture of reflective conductive films which have the capability to transform the development of this technology, particularly in terms of cost.

DETAILED DESCRIPTION OF THE INVENTION

The Polymeric Substrate

The polymeric substrate is a self-supporting film or sheet by which is meant a film or sheet capable of independent existence in the absence of a supporting base. The substrate is preferably uniaxially or biaxially oriented, preferably biaxially oriented. The substrate is a multilayer substrate. The substrate may comprise one or more polymeric binding layer(s). Thus, the substrate may comprise a polymeric binding layer on one or both surfaces of the polymeric base layer.

The polymeric material of the binding layer should soften under heat to a sufficient extent that its viscosity becomes low enough to allow adequate wetting for it to adhere to the surface to which it is being bonded. The polymeric material of the binding layer should soften under heat, without melting or softening of other (non-heat-sealable) layer(s) in the film. In the present invention, $T_{S-HS}$ is at least about 5° C. below, preferably at least about 10° C. below, preferably at least about 20° C. below, preferably at least about 50° C. below $T_{S-B}$, preferably at least about 70° C. below $T_{S-B}$, and in one embodiment at least about 100° C. below $T_{S-B}$. Preferably, $T_{S-HS}$ is in the range of from about 30 to about 250° C., more preferably from about 50 to about 200° C., and more preferably from about 70 to about 150° C. Typically, $T_{S-HS}$ is greater than or equal to $T_{g-HS}$ wherein $T_{g-HS}$ is the glass transition temperature of the polymeric material of the binding layer, and typically $T_{S-HS}$ is at least about 10° C. greater than $T_{g-HS}$.

It will be appreciated that the multilayer polymeric substrate is typically heat-sealable, comprising a base layer and a heat-sealable layer. Thus, the binding layer is suitably a heat-sealable layer. The base layer is suitably non-heat-sealable. The process for the manufacture of a conductive film according to the present invention suitably comprises the steps of providing a polymeric substrate comprising a polymeric base layer and a polymeric heat-sealable layer. The multilayer substrate may be heat-sealable on one or both surfaces thereof.

As used herein, the term "softening temperature" is defined as the minimum temperature at which the heat-seal strength to itself of a layer in said substrate is equal to or higher than 100 g/25 mm, measured as described herein.

As used herein, the term "non-heat-sealable" refers to a layer which exhibits a heat-seal strength to itself of less than 100 g/25 mm, measured as described herein at a sealing temperature of 140° C., particularly at a sealing temperature of 180° C., particularly at a sealing temperature of 190° C., particularly at a sealing temperature of 200° C., particularly at a sealing temperature of 225° C., and particularly at a sealing temperature of 250° C.

The polymeric material of the binding layer typically has a degree of crystallinity (DOC) different to that of the base layer. Preferably, the polymeric material of the binding layer is substantially amorphous, and preferably has a DOC of from about 0% to about 15%, more preferably from about 0% to about 10%, more preferably from about 0% to about 5%, measured as defined herein. Preferably, the polymeric material of the base layer is semi-crystalline, and preferably has a DOC of at least about 15%, more preferably at least about 20%, more preferably at least about 30%, more preferably at least about 40%, and normally no higher than about 80%, measured as defined herein. An amorphous polymer normally begins to soften at its $T_G$ or above. A semi-crystalline polymer begins to soften only at temperatures approaching its crystalline melting point $T_M$, for example at about $(T_M-5)°$ C.

The polymeric material(s) of the substrate are preferably selected from polyester. The polyester(s) which constitute the substrate is/are typically synthetic linear polyester(s). Suitable polyesters are obtainable by condensing one or more dicarboxylic acid(s) or their lower alkyl (up to 6 carbon atoms) diesters with one or more diols. The dicarboxylic acid component typically contains at least one aromatic dicarboxylic acid, which is preferably terephthalic acid, isophathalic acid, phthalic acid, 1,4-, 2,5-, 2,6- or 2,7-naphthalenedicarboxylic acid, and is preferably terephthalic acid or 2,6-naphthalenedicarboxylic acid. The polyester may also contain one or more residues derived from other dicarboxylic acids such as 4,4'-diphenyldicarboxylic acid, hexahydro-terephthalic acid, 1,10-decanedicarboxylic acid, and in particular aliphatic dicarboxylic acids including those of the general formula $C_nH_{2n}(COOH)_2$ wherein n is 2 to 8, such as succinic acid, glutaric acid sebacic acid, adipic acid, azelaic acid, suberic acid or pimelic acid, preferably sebacic acid, adipic acid and azelaic acid, and more preferably azelaic acid. The diol(s) is/are preferably selected from aliphatic and cycloaliphatic glycols, e.g. ethylene glycol, 1,3-propanediol, 1,4-butanediol, neopentyl glycol and 1,4-cyclohexanedimethanol, preferably from aliphatic glycols. Optionally, the diol fraction may additionally comprise a minor proportion of one or more poly(alkylene oxide) glycol(s), typically selected from those containing $C_2$ to $C_6$ alkylene chains, and preferably polyethylene glycol (PEG). The average molecular weight of any poly(alkylene oxide) glycol used in the present invention is typically in the range of from about 350 to about 10,000 g/mol, and it is typically present in a copolyester in no more than about 15 mol % of the glycol fraction of the copolyester, and in one embodiment in the range of from about 10 to about 15 mol % of the glycol fraction. Preferably the polyester contains only one glycol, preferably ethylene glycol. Formation of the polyester is conveniently effected in a known manner by condensation or ester interchange, generally at temperatures up to about 295° C.

The base layer preferably comprises a synthetic linear polyester selected from those mentioned herein above, particularly a polyester derived from one dicarboxylic acid, preferably an aromatic dicarboxylic acid, preferably terephthalic acid or naphthalenedicarboxylic acid, more preferably terephthalic acid, and one glycol, particularly an aliphatic or cycloaliphatic glycol, preferably ethylene glycol. Polyethylene terephthalate (PET) or polyethylene 2,6-naphthalate (PEN), particularly PET, is the preferred polyester of the base layer. In an alternative embodiment, the polyester is a copolyester comprising an aromatic dicarboxylic acid, preferably terephthalic acid or naphthalenedicarboxylic acid, more preferably terephthalic acid, an aliphatic glycol (preferably ethylene glycol), and a poly(alkylene oxide) glycol (preferably (PEG)). The film-forming polymeric resin is the major component of the base layer, and the polymeric resin makes up at least 50%, preferably at least 65%, preferably at least 80%, preferably at least 90%, and preferably at least 95% by weight of the total weight of the base layer.

The binding layer preferably comprises a copolyester derived from at least two of the dicarboxylic acid(s) or their lower alkyl diesters with one or more of the glycol(s) referred to herein. The copolyester resin is the major component of the binding layer, and the copolyester makes up at least 50%, preferably at least 65%, preferably at least 80%, preferably at least 90%, and preferably at least 95% by weight of the total weight of the binding layer.

In one embodiment, hereinafter referred to as Embodiment A, the binding layer comprises a copolyester derived from one or more aliphatic glycol(s) and two or more dicarboxylic acids, preferably two or more aromatic dicarboxylic acids. Typically, the copolyester is derived from a single aliphatic glycol which in a preferred embodiment is ethylene glycol. Preferably, the dicarboxylic acids are terephthalic acid and one other dicarboxylic acid, preferably one other aromatic dicarboxylic acid, and preferably isophthalic acid. A preferred copolyester is derived from ethylene glycol, terephthalic acid and isophthalic acid. The preferred molar ratios of the terephthalic acid component to the isophthalic acid component are in the range of from 25:75 to 90:10, preferably 50:50 to 85:15, and in one embodiment from 50:50 to 75:25, and in a further embodiment the molar ratio is in the range from 65:35 to 85:15. In a specific embodiment, this copolyester is a copolyester of ethylene glycol with about 82 mol % terephthalate and about 18 mol % isophthalate. In a further specific embodiment, this copolyester is a copolyester of ethylene glycol with about 60 mol % terephthalate and about 40 mol % isophthalate. In a further specific embodiment, this copolyester is a copolyester in which the dicarboxylic acids are terephthalic acid and isophthalic acid in the aforementioned preferred molar ratios, and the glycols are ethylene glycol and a poly(alkylene oxide) glycol (preferably (PEG)) in the aforementioned preferred molar ratios.

In a further embodiment, hereinafter referred to as Embodiment B, the binding layer comprises a copolyester resin derived from at least one (and preferably only one) aromatic dicarboxylic acid and at least one (and preferably only one) aliphatic dicarboxylic acid (or their lower alkyl (i.e. up to 14 carbon atoms) diesters) with one or more glycol(s). A preferred aromatic dicarboxylic acid is terephthalic acid. Preferred aliphatic dicarboxylic acids are selected from sebacic acid, adipic acid and azelaic acid, particularly azelaic acid. The concentration of the aromatic dicarboxylic acid present in the copolyester is preferably no more than about 90 mol %, preferably no more than about 80 mol %, and preferably in the range from 45 to 80 mol %, more preferably 50 to 70 mol %, and particularly 55 to 65 mol % based on the dicarboxylic acid components of the copolyester. The concentration of the aliphatic dicarboxylic acid present in the copolyester is preferably at least about 10 mol %, preferably at least about 20 mol %, and preferably in the range from 20 to 55, more preferably 30 to 50, and particularly 35 to 45 mol % based on the dicarboxylic acid components of the copolyester. Preferably, the glass transition temperature ($T_{g\text{-}HS}$) of the copolyester in Embodiment B is no more than about 20° C., preferably no more than about 10° C., preferably no more than about 0° C., and preferably no more than about −10° C. In one embodiment, the melting point ($T_m$) of the copolyester of the binding layer is preferably no more than about 160° C., preferably no more than about 150° C., and more preferably no more than about 140° C. Particularly preferred examples of such copolyesters are (i) copolyesters of azelaic acid and terephthalic acid with an aliphatic glycol, preferably ethylene glycol; (ii) copolyesters of adipic acid and terephthalic acid with an aliphatic glycol, preferably ethylene glycol; and (iii) copolyesters of sebacic acid and terephthalic acid with an aliphatic glycol, preferably butylene glycol. Preferred polymers include a copolyester of sebacic acid/terephthalic acid/butylene glycol (preferably having the components in the relative molar ratios of 45-55/55-45/100, more preferably 50/50/100) having a glass transition point ($T_g$) of −40° C. and a melting point ($T_m$) of 117° C.), and a copolyester of azelaic acid/terephthalic acid/ethylene glycol (preferably having the components in the relative molar ratios of 40-50/60-50/100, more preferably 45/55/100) having a $T_g$ of −15° C. and a $T_m$ of 150° C.

In a further embodiment, hereinafter referred to as Embodiment C, the binding layer comprises a copolyester derived from an aliphatic diol and a cycloaliphatic diol with one or more, preferably one, dicarboxylic acid(s), preferably an aromatic dicarboxylic acid. Examples include copolyesters of terephthalic acid with an aliphatic diol and a cycloaliphatic diol, especially ethylene glycol and 1,4-cyclohexanedimethanol. The preferred molar ratios of the cycloaliphatic diol to the aliphatic diol are in the range from 10:90 to 60:40, preferably in the range from 20:80 to 40:60, and more preferably from 30:70 to 35:65. In a preferred embodiment this copolyester is a copolyester of terephthalic acid with about 33 mole % 1,4-cyclohexane dimethanol and about 67 mole % ethylene glycol. An example of such a polymer is PETG™ 6763 (Eastman) having a $T_g$ of about 81° C., which comprises a copolyester of terephthalic acid, about 33% 1,4-cyclohexane dimethanol and about 67% ethylene glycol and which is always amorphous. In an alternative embodiment, the binding layer polymer may comprise butane diol in place of ethylene glycol.

The thickness of the binding layer is generally between about 1 and 30%, preferably about 10 and 20% of the thickness of the substrate. The binding layer may have a thickness of up to about 25 μm, more preferably up to about 20 μm, more preferably up to about 15 μm, and preferably at least about 1 μm, more preferably at least about 2 μm, and more preferably at least about 5 μm. The overall thickness of the substrate is preferably up to about 350 μm, more preferably up to about 200 μm, more preferably at least about 20 μm, more preferably between about 50 and 150 μm.

Preferably, a binding layer of the substrate exhibits a heat-seal strength to itself of at least 250 g/25 mm, more preferably at least 300 g/25 mm, more preferably at least 400 g/25 cm, more preferably at least 500 g/25 cm, more preferably at least 750 g/25 cm, more preferably at least 1000 g/25 cm, and typically no more than about 4000 g/25 mm, more typically no more than about 3500 g/25 mm. In one embodiment, a binding layer of the substrate exhibits a heat-seal strength to itself of from about 400 g/25 mm to about 1000 g/25 mm, and in a further embodiment from about 500 to about 850 g/25 mm.

Formation of the substrate may be effected by conventional extrusion techniques well-known in the art, and in particular by co-extrusion, as described below. In general terms the process comprises the steps of extruding a layer of molten polymer, quenching the extrudate and orienting the quenched extrudate in at least one direction. The substrate may be uniaxially-oriented, but is more typically biaxially-oriented. Orientation may be effected by any process known in the art for producing an oriented film, for example a tubular or flat film process. Biaxial orientation is effected by drawing in two mutually perpendicular directions in the plane of the film to achieve a satisfactory combination of mechanical and physical properties. In a tubular process, simultaneous biaxial orientation may be effected by extruding a thermoplastics polyester tube which is subsequently quenched, reheated and then expanded by internal gas pressure to induce transverse orientation, and withdrawn at a rate which will induce longitudinal orientation. In the preferred flat film process, the film-forming polyester is extruded through a slot die and rapidly quenched upon a chilled casting drum to ensure that the polyester is quenched to the amorphous state. Orientation is then effected by stretching the quenched extrudate in at least one direction at a temperature above the glass transition temperature of the polyester. Sequential orientation may be effected by stretching a flat, quenched extrudate firstly in one direction, usually the longitudinal direction, i.e. the forward direction through the film stretching machine, and then in the transverse direction. Forward stretching of the extrudate is conveniently effected over a set of rotating rolls or between two pairs of nip rolls, transverse stretching then being effected in a stenter apparatus. Stretching is generally effected so that the dimension of the oriented film is from 2 to 5, more preferably 2.5 to 4.5 times its original dimension in the or each direction of stretching. Typically, stretching is effected at temperatures higher than the $T_g$ of the polyester, preferably about 15° C. higher than the $T_g$. Greater draw ratios (for example, up to about 8 times) may be used if orientation in only one direction is required. It is not necessary to stretch equally in the machine and transverse directions although this is preferred if balanced properties are desired.

A stretched film may be, and preferably is, dimensionally stabilised by heat-setting under dimensional support at a temperature above the glass transition temperature of the polyester but below the melting temperature thereof, to induce the desired crystallisation of the polyester. During the heat-setting, a small amount of dimensional relaxation may be performed in the transverse direction, TD by a procedure known as "toe-in". Toe-in can involve dimensional shrinkage of the order 2 to 4% but an analogous dimensional relaxation in the process or machine direction, MD is difficult to achieve since low line tensions are required and film control and winding becomes problematic. The actual heat-set temperature and time will vary depending on the composition of the film and its desired final thermal shrinkage but should not be selected so as to substantially degrade the toughness properties of the film such as tear resistance. Within these constraints, a heat set temperature of about 180 to 245° C. is generally desirable. After heat-setting the film is typically quenched rapidly in order induce the desired crystallinity of the polyester and, in particular, the binding layer.

In certain embodiments of the present invention, the film may be further stabilized through use of an on-line relaxation stage. Alternatively the relaxation treatment can be performed off-line. In this additional step, the film is heated at a temperature lower than that of the heat-setting stage, and with a much reduced MD and TD tension. The tension experienced by the film is a low tension and typically less than 5 kg/m, preferably less than 3.5 kg/m, more preferably in the range of from 1 to about 2.5 kg/m, and typically in the range of 1.5 to 2 kg/m of film width. For a relaxation process which controls the film speed, the reduction in film speed (and therefore the strain relaxation) is typically in the range 0 to 2.5%, preferably 0.5 to 2.0%. There is no increase in the transverse dimension of the film during the heat-stabilisation step. The temperature to be used for the heat stabilisation step can vary depending on the desired combination of properties from the final film, with a higher temperature giving better, i.e. lower, residual shrinkage properties. A temperature of 135 to 250° C. is generally desirable, preferably 150 to 230° C., more preferably 170 to 200° C. The duration of heating will depend on the temperature used but is typically in the range of 10 to 40 seconds, with a duration of 20 to 30 seconds being preferred. This heat stabilisation process can be carried out by a variety of methods, including flat and vertical configurations and either "off-line" as a separate process step or "in-line" as a continuation of the film manufacturing process. Film thus processed will exhibit a smaller thermal shrinkage than that produced in the absence of such post heat-setting relaxation, such that the shrinkage is typically less than 1% over 30 minutes in an oven at 190° C., particularly less than 0.5%, and particularly less than 0.2%.

Formation of a multi-layer substrate comprising a binding layer and a base layer is preferably effected by co-extrusion, either by simultaneous coextrusion of the respective film-forming layers through independent orifices of a multi-orifice die, and thereafter uniting the still molten layers or, preferably, by single-channel coextrusion in which molten streams of the respective polymers are first united within a channel leading to a die manifold, and thereafter extruded together from the die orifice under conditions of streamline flow without intermixing thereby to produce a multi-layer polymeric film, which may be oriented and heat-set as hereinbefore described. Other methods of forming the multilayer substrate include casting the binding layer onto a preformed base layer, and coating the binding polymer onto the base layer, and the coating technique may be preferred for Embodiment B in particular. Coating may be effected using any suitable coating technique, including gravure roll coating, reverse roll coating, dip coating, bead coating, extrusion-coating, melt-coating or electrostatic spray coating. Coating of the binding layer is conducted "in-line", i.e. wherein the coating step takes place during film manufacture and before, during or between any stretching operation(s) employed. Where the binding layer is coated, the coating step preferably avoids the use of organic solvent, which has conventionally been used to apply heat-sealable coatings such as those of Embodiment B, and this may be achieved using the in-line processes described in WO-02/059186-A, for example. Prior to application of a binding layer onto the base layer, the exposed surface of the base layer may, if desired, be subjected to a chemical or physical surface-modifying treatment to improve the bond between that surface and the subsequently applied layer. For example, the exposed surface of the base layer may be subjected to a high voltage electrical stress accompanied by corona discharge. Alternatively, the base layer may be pre-treated with an agent known in the art to have a solvent or swelling action on the base layer, such as a halogenated phenol dissolved in a common organic solvent e.g. a solution of p-chloro-m-cresol, 2,4-dichlorophenol, 2,4,5- or 2,4,6-trichlorophenol or 4-chlororesorcinol in acetone or methanol.

In a preferred embodiment, however, the substrate is a multilayer coextruded substrate comprising a binding layer and a base layer.

The polyester layers in the substrate may conveniently contain any of the additives conventionally employed in the manufacture of polyester films. Thus, agents such as cross-linking agents, dyes, pigments, voiding agents, lubricants, anti-oxidants, radical scavengers, UV absorbers, thermal stabilisers, flame retardants and inhibitors, anti-blocking agents, surface active agents, slip aids, optical brighteners, gloss improvers, prodegradents, viscosity modifiers and dispersion stabilisers may be incorporated as appropriate.

In particular, and as is conventional in the art, the handling and windability of the film during manufacture can be improved by the addition of a particulate filler. The particulate filler may, for example, be a particulate inorganic filler (e.g. metal or metalloid oxides, such as alumina, titania, talc and silica (especially precipitated or diatomaceous silica and silica gels), calcined china clay and alkaline metal salts, such as the carbonates and sulphates of calcium and barium). The particulate inorganic filler should be finely-divided, and the volume distributed median particle diameter (equivalent spherical diameter corresponding to 50% of the volume of all the particles, read on the cumulative distribution curve relating volume % to the diameter of the particles—often referred to as the "D(v,0.5)" value) thereof is preferably in the range from 0.01 to 5 µm, more preferably 0.05 to 1.5 µm, and particularly 0.15 to 1.2 µm. Preferably at least 90%, more preferably at least 95% by volume of the inorganic filler particles are within the range of the volume distributed median particle diameter ±0.8 µm, and particularly ±0.5 µm. Particle size of the filler particles may be measured by electron microscope, coulter counter, sedimentation analysis and static or dynamic light scattering. Techniques based on laser light diffraction are preferred. The median particle size may be determined by plotting a cumulative distribution curve representing the percentage of particle volume below chosen particle sizes and measuring the 50th percentile. In one embodiment, the binding layer may comprises up to about 5% by weight (based on the total weight of the layer), preferably no more than about 2% by weight, and preferably no more than about 1.5% weight, of inorganic filler particles. The filler particles are selected from the filler particles referred to hereinabove, and are preferably selected from silica and talc, preferably silica.

The reflectivity of the substrate is imparted by the incorporation therein of an effective amount of one or more reflecting agent(s). Suitable reflecting agents include a particulate inorganic filler such as those referred to hereinabove, an incompatible resin filler, or a mixture of two or more such fillers. Reflecting agent(s) are preferably selected from whitening agent(s). Preferably the reflecting agent is a particulate inorganic filler, preferably titanium dioxide and/or barium sulphate. In one embodiment, the filler is titanium dioxide. The amount of reflecting agent incorporated into the substrate is typically in the range of from 5% to 60% by weight, preferably 5% to 30% by weight, preferably 10% to 25% by weight, based on the weight of the polymeric material of a given layer. The reflecting agent(s) may be present in either the base layer or the binding layer of the polymeric substrate, or may be present in both the base layer and the binding layer. In one embodiment, the reflecting agent(s) is/are present only in the base layer. In one embodiment, only the base layer comprises reflecting agent(s) in the range of from 5% to 60% by weight, preferably 5% to 30% by weight, preferably 10% to 25% by weight, based on the weight of the polymeric material of the layer.

The reflective polymeric substrate preferably exhibits a reflectance at 540 nm, measured as herein described, of at least about 75%, preferably at least about 80%, more preferably at least about 85%.

The binding layer may comprise one or more waxes, and this is particularly appropriate where the binding layer of Embodiment B is manufactured by coextrusion with the base-layer. Typically only one type of wax is used. The wax may be a natural or synthetic wax, and preferably has a melting point of at least 50° C. Natural waxes are preferably either vegetable waxes (such as carnauba wax) or mineral waxes (such as montan waxes and ozocerite). Paraffin waxes (highly-refined low-molecular weight waxes comprising straight-chain hydrocarbons) may also be used. Examples of synthetic waxes include Fischser-Tropsch waxes (produced by coal gasification, and having a molecular weight in the range from about 300 to about 1400 g/mol)), and oxidised and non-oxidised (preferably oxidised) low molecular weight polyethylene waxes (having a molecular weight in the range from about 500 to about 3000 g/mol) as well as the corresponding polypropylene waxes. However, a preferred class of waxes are amide waxes. Amidic waxes are generally immiscible with the base copolyester of the binding layer. The amide wax may be a primary, secondary, tertiary or bis(fatty) amide, such as oleamide and erucamide. Examples of the different types include primary fatty amides such as erucamide, behenamide, oleamide or stearamide; secondary fatty amides such as stearylerucamide, erucylerucamide, oleylpalmitamide, stearylstearamide or erucyistearamide; tertiary fatty amides such as dimethylstearamide or diethylstearamide; and N,N'-bis(fatty) amides such as N,N'-ethylene bis(stearamide), N,N'-methylene bis(stearamide), N,N'-propylene bis(stearamide), N,N'-ethylene bis(oleamide), N,N'-methylene bis(oleamide), or N,N'-propylene bis(oleamide). Preferably, the wax is selected from N,N'-bis(fatty) amides, and more preferably from N,N'-ethylene bis(oleamide) and N,N'-ethylene bis(stearamide). In a preferred embodiment, the wax is present at a level of from about 0.1 to about 3 wt %, preferably from about 0.5 to about 3 wt %, preferably no more than 2 wt %, and typically from about 1 to about 2 wt % of the total weight of the binding layer.

The components of the composition of a layer may be mixed together in a conventional manner. For example, by mixing with the monomeric reactants from which the film-forming polyester is derived, or the components may be mixed with the polyester by tumble or dry blending or by compounding in an extruder, followed by cooling and, usually, comminution into granules or chips. Masterbatching technology may also be employed.

In embodiments where the substrate comprises a base layer and a single binding layer, the surface of the base layer in contact with the binding layer is referred to herein as the primary side. The surface of the base layer opposite to the surface which is in contact with the binding layer is referred to herein as the secondary side. The secondary side of the base layer may have thereon one or more further polymeric layers or coating materials. Any coating of the secondary side is preferably performed "in-line". In one embodiment, the additional coating on the secondary side may comprise a "slip coating" in order to improve the handling and windability of the film, particularly when the base layer is a PET polyester substrate. A suitable slip coating may be, for instance a discontinuous layer of an acrylic and/or methacrylic polymeric resin optionally further comprise a cross-linking agent, such as described in EP-A-0408197, the disclosure of which is incorporated herein by reference. An alternative slip coating may comprise a potassium silicate coating, for instance as disclosed in U.S. Pat. Nos. 5,925,428 and 5,882,798, the disclosures of which are incorporated herein by reference.

The substrate exhibits a low shrinkage, and preferably less than 3% at 190° C. over 30 minutes, preferably less than 2%, preferably less than 1%, and preferably less than 0.5%, preferably less than 0.2%.

The Conductive Nanowires

The use of nanowires to form a conductive layer is known in the art, for instance from WO-A-2007/022226, the disclosure in respect of the identity and manufacture of nanowires is incorporated herein by reference. As used herein, the term "nanowire" refers to a conductive element having an aspect ratio (i.e. the length L divided by the width W) typically in the range of 10 to 100,000. The aspect ratio is greater than 10, preferably greater than 50, and more preferably greater than 100. At least one cross sectional dimension of the nanowire is less than 500 nm, preferably less than 200 nm, and more preferably less than 100 nm.

The optical and electrical properties of the conductive layer are determined not only by aspect ratio, but also by their size, shape, distribution and density. As the diameter of the nanowire increases, the resistivity decreases substantially although it will absorb more light. For instance, overall resistivity reduces significantly as the diameter increases from 10 nm to 100 nm, but this improvement in electrical properties must be balanced against the increased light absorption. As with the provision of transparent conductive films, the provision of reflective conductive films using conductive nanowires requires that the nanowire component should exhibit a sufficiently low absorption of light that the reflectance of the underlying substrate is not adversely affected to a significant degree. When high aspect ratios are used, the nanowire density required to achieve a conductive network can be low enough that the conductive network is substantially transparent. The number of nanowires for a given density is selected to provide acceptable electrical conduction properties. For example, hundreds of nanowires extending between two terminals can provide a low resistance electrical conduction path, with the concentration, aspect ratio, size and shape being selected to provide a substantially transparent conductive network. The distance between two electrical terminals may be such that the desired optical properties are not obtained with a single nanowire, and a plurality of many nanowires may need to be linked to each other at various points to provide a conductive path. Nanowire selection is normally determined by the target optical properties, and the number of nanowires that provides the desired conduction path and overall resistance on that path are then selected to achieve acceptable electrical properties for the conductive layer. The electrical conductivity of the conductive layer is mainly controlled by:

a) the conductivity of a single nanowire,
b) the number of nanowires between the terminals, and
c) the connectivity between the nanowires.

Below a certain nanowire concentration (also referred to as the electrical percolation threshold), the conductivity between the terminals is zero, i.e. there is no continuous current path provided because the nanowires are spaced too far apart. Above this concentration, there is at least one current path available. As more current paths are provided, the overall resistance of the layer decreases.

Conductive nanowires include metal nanowires and other conductive particles having high aspect ratios (i.e. higher than 10). Examples of non-metallic nanowires include, but are not limited to, carbon nanotubes (CNTs), conductive polymer fibers and the like. In one advantageous embodiment, the nanowires are metal nanowires. As used herein, the term "metal nanowire" refers to a nanowire comprising elemental metal, metal alloys or metal compounds (including metal oxides). Metals, metal alloys and metal oxides that can be used as nanowires include, without limitation, Cu, Au, Ag, Ni, Pd, Co, Pt, Ru, W, Cr, Mo, Ag, Co alloys (e.g. CoPt), Ni alloys, Fe alloys (e.g. FePt) Or $TiO_2$, $Co_3O_4$, $Cu_2O$, $HfO_2$, ZnO, vanadium oxides, indium oxide, aluminum oxide, indium tin oxide, nickel oxide, copper oxide, tin oxide, tantalum oxide, niobium oxide, vanadium oxide or zirconium oxide. Suitable metal nanowires can be based on any metal, and of particular utility are silver, gold, copper, nickel, and gold-plated silver. Metal nanowires can be prepared by methods known in the art. For instance, silver nanowires can be synthesized through solution-phase reduction of a silver salt (e.g., silver nitrate) in the presence of a polyol (e.g., ethylene glycol) and polyvinyl pyrrolidone), as reported in *Nano Lett.* 2002, 2, 165. Alternatively, metal nanowires can be prepared using biological materials as templates, including for instance proteins, peptides, phages, bacteria, viruses, and the like, as discussed in WO-A-2007/022226. The use of biological template allows for the selective formation of conductive layers having a highly connected network than would be possible with random nanowires, as well as selective formation of nanowires having particular dimensions, morphologies and compositions.

A conductive layer of nanowires comprises a (typically sparse) network of nanowires. As used herein, the term "conductive layer" refers to the network of nanowires that provide the conductive media of the conductive composite films disclosed herein. Conductivity is normally achieved by electrical charge percolation from one nanowire to another, thereby requiring a sufficient amount of nanowires to be present in the conductive layer to reach an electrical percolation threshold and become conductive. The amount (also referred to as the "threshold loading level") of nanowires required to achieve the desired sheet resistance depends on factors such as the aspect ratio, the degree of alignment, degree of agglomeration and the resistivity of the nanowires.

In the case of silver nanowires, for example, high aspect ratios allow for the formation of a conductive network at a threshold surface loading level which is preferably in the range from about 0.05 µg/cm$^2$ to about 10 µg/cm$^2$, more preferably from about 0.1 µg/cm$^2$ to about 5 µg/cm$^2$ and more preferably from about 0.8 µg/cm$^2$ to about 3 µg/cm$^2$. Higher loading levels tend to compromise the mechanical or optical properties of the polymeric matrix. The precise loading levels depend strongly on the dimensions and spatial dispersion of the nanowires. Advantageously, transparent conductive networks of tunable electrical conductivity and optical transparency can be provided by adjusting the loading levels of the metal nanowires.

In the present invention, the nanowires are held partially or completely within the polymeric matrix of the binding layer of the substrate. Thus, the "conductive layer" defined by the nanowire network may, at least partially, occupy the same space as the binding layer. Portions of the nanowire network may protrude from the polymeric matrix, for instance to enable electrical connection to the conductive network. The polymeric matrix of the binding layer advantageously protects the nanowire network from adverse environmental factors, such as corrosion and abrasion, and provides the conductive layer with desirable physical and mechanical properties, including adhesion to the substrate, strength and flexibility.

In one embodiment, the conductive layer spans the entire thickness of the polymeric matrix of the binding layer. Advantageously, a portion of the nanowires may be exposed on a surface of the polymeric matrix, which is particularly useful for touch screen applications. In particular, a conductive film can display surface conductivity on at least one surface thereof. While some nanowires may be entirely submerged in the matrix, other nanowires protrude above the surface. If enough nanowires protrude above the matrix, then the surface of the conductor becomes conductive.

In an alternative embodiment, the conductive layer formed by the nanowire network is entirely submerged in a portion of the polymeric matrix of the binding layer.

The nanowires may be used in association with corrosion inhibitors, as taught in WO-A-2007/022226, which should be soluble or miscible and otherwise compatible with the polyester(s) of the substrate layer, and in particular with the copolyester(s) of the binding layer.

The Composite Film and Manufacture Thereof

Application of the conductive layer to the substrate is typically effected by dispersing the nanowires into a liquid vehicle, and then coating the composition onto the surface of the binding layer of the substrate. Any suitable liquid vehicle may be used, including organic solvents (such as alcohols, ketones, ethers or volatile hydrocarbons), but preferably the coating composition is an aqueous dispersion. The liquid vehicle may optionally contain additives such as viscosity modifiers, surfactants, corrosion inhibitors and the like, as is known in the art. For instance, a nanowire dispersion may comprise, by weight:

(i) from 0.0025% to 0.1% surfactant (for example Zonyl® FSO-100);
(ii) from 0.02% to 4% viscosity modifier (for example, hydroxyl propyl methyl cellulose);
(iii) from 0.05% to 1.4% metal nanowires (for example, silver nanowires; and
(iv) from 94.5% to 99.0% solvent (for example, water or isopropanol).

The weight ratio of the surfactant to the viscosity modifier is preferably in the range of about 80:1 to about 0.01:1. The weight ratio of the viscosity modifier to the nanowires is preferably in the range of about 5:1 to about 0.000625:1. The ratio of the metal nanowires to the surfactant is preferably in the range of about 560:1 to about 5:1. The viscosity of the nanowire dispersion is preferably in the range of from about 1 to about 100 cP.

Coating may be effected using any suitable coating technique, including gravure roll coating, reverse roll coating, dip coating, bead coating, extrusion-coating, melt-coating or electrostatic spray coating.

The conductive layer may be applied to the surface of the binding layer of the substrate after the film manufacture process has been completed (referred to herein as "off-line" application), i.e. after the heat-setting and optional heat-stabilisation steps described hereinabove have been conducted. Following deposition of the nanowires, the film is heated to a temperature $T_1$, as defined hereinabove. In this embodiment, there is no need for the additional step of over-coating the deposited nanowires with an abrasion-resistant or binder layer, thereby improving the efficiency of the manufacturing process.

In a preferred embodiment, however, the conductive layer is applied to the surface of the binding layer of the substrate during the film manufacturing process (referred to herein as "in-line" application), and in particular prior to the heat-setting step. In this embodiment, the nanowires may be applied to the surface of the binding layer of the substrate before or after the stretching steps have been completed, but preferably between the two stages (longitudinal and transverse) of the biaxial stretching operation described hereinabove. Following deposition of the nanowires, the film is heated to a temperature $T_1$, as defined hereinabove, and this is preferably effected by the heat-setting step conventionally used in the film manufacturing process described hereinabove. In this preferred embodiment, not only is there no need for the additional step of over-coating the deposited nanowires with an abrasion-resistant or binder layer, but there is also no need for a separate off-line step of deposition of the nanowires. The production of the conductive film is achieved in a single pass, with the deposition and binding of the nanowires being effected during film manufacture, thereby greatly improving the efficiency of the manufacturing process.

In either of the process embodiments described immediately above, the binding layer may be coated onto the base layer, although preferably the base layer and the binding layers are coextruded.

The heating temperature $T_1$ is typically at least about 50° C., more typically at least about 80° C. and typically less than about 240° C., typically less than about 220° C., and typically less than about 200° C. The duration of the heating step is preferably in the range of from about 10 seconds to about 5 minutes, preferably from about 20 seconds to about 3 minutes and typically from about 30 seconds to about 60 seconds. The heating of the coated substrate causes the nanowires to sink at least partially into the polymeric matrix of the binding layer. In one embodiment, the nanowires sink below the surface of the binding layer so that they are fully submerged within the layer.

The nanowire network may require additional processing steps to render it electrically conductive, for instance exposure to plasma, corona discharge, UV-ozone, or pressure.

In one embodiment, the composite film comprising substrate and conductive layer is optionally compressed, either during or subsequent to the heating step, and this may assist in increasing the conductivity of the nanowire network layer.

The compression force is preferably at least 44 N/mm², more preferably at least 135 N/mm², more preferably at least 180 N/mm², but typically no more than 1000 N/mm². The compression can be effected using conventional methods, including sheet pressing and roll pressing, and preferably by roll pressing in which the film to be compressed is held between rolls and compressed as the rolls rotate, thereby allowing roll-to-roll production.

The conductive layer may be formed on both sides of a substrate comprising a base layer and on each surface thereof a binding layer, the same or different.

The nanowires can be deposited in a pre-determined pattern. Thus, prior to deposition of the nanowires, the surface of the binding layer of the substrate may be pre-treated in accordance with a pre-determined pattern, for instance using a plasma surface treatment carried out through an aperture mask having the desired pattern. Nanowires deposited on the pre-treated region of the surface exhibit greater adhesion relative to the untreated region and, accordingly, patterned deposition can be achieved by removing the nanowires on the untreated region by an appropriate method (such as washing with a suitable solvent, brushing or by transferring them to a tacky or adhesive roller). Alternatively, a roller (e.g. a Gravure roller) or stamp having recesses of a predetermined pattern can be used to coat the nanowire dispersion, thereby enabling patterned deposition and production of a patterned conductive layer. The conductive layer can also be patterned by spraying the nanowire onto the substrate through an aperture mask.

The composite film and process of the present invention are particularly advantageous because they provide the nanowire network with sufficient mechanical strength and abrasion resistance without the need for an additional over-coating step in which the nanowire-coated substrate is coated with an additional protective layer (for instance further polymeric material), as hitherto required for the manufacture of nanowire-containing transparent conductive films of practical utility. Thus, the process of the present invention avoids the need for, and excludes the step of, over-coating said deposited nanowires with an overcoat matrix, for instance a barrier or protective layer (such as an abrasion-resistant or binder layer), for instance where the nanowire network becomes at least partially embedded in said overcoat matrix as a result of said over-coating step.

The conductive film produced according to the invention described herein preferably exhibits a sheet resistance of no more than about $10^6$ Ω/square, preferably no more than about 100,000 Ω/square, preferably no more than about 50,000 Ω/square preferably no more than about 10,000 Ω/square, preferably no more than about 1,000 Ω/square, preferably no more than 750 Ω/square, preferably no more than 500 Ω/square, preferably no more than 250 Ω/square, and most preferably no more than 100 Ω/square, and is typically at least 1 Ω/square.

In one embodiment, the reflective conductive composite film comprising polymeric substrate and conductive layer preferably exhibits a reflectance at 540 nm, measured as herein described, of at least about 60%, more preferably of at least about 70%, more preferably at least about 75%, and in one embodiment, at least about 80%.

According to a further aspect of the present invention, there is provided a reflective conductive film comprising:
(i) a reflective polymeric substrate comprising a polymeric base layer and a polymeric binding layer; and
(ii) a conductive layer comprising a plurality of nanowires, wherein said nanowires are bound by the polymeric matrix of the binding layer such that the nanowires are dispersed at least partially in the polymeric matrix of the binding layer, particularly such a film obtained by the process as defined in claim 1.

The reflective conductive films made according to the process described herein exhibit the following properties:
(i) low sheet resistance, as defined herein;
(ii) high reflectance (particularly high diffuse reflectance), as defined herein;
(iii) excellent adhesion of the nanowires to the substrate; and
(iv) good abrasion resistance of the nanowires,
which are at least comparable with reflective conductive films made according to a conventional process, or which satisfy the threshold levels for that property required by a commercial reflective conductive film. Thus, it will be appreciated that the primary objective of the invention is an improved process for the manufacture of reflective conductive films exhibiting properties which are commercially acceptable and/or comparable to those of the prior art, rather than seeking to improve those properties per se. Some of the films produced according to the present invention might be inferior in certain properties (for instance, abrasion resistance or reflectance) when compared with the best prior art films, but all have commercial utility and, more importantly, all are produced via a process which advantageously offers significant improvements in efficiency and economy.

According to a further aspect of the invention, there is provided the use of a reflective polymeric substrate comprising a polymeric base layer and a polymeric binding layer as a substrate in the manufacture of a reflective conductive film comprising a conductive layer comprising a plurality of nanowires.

The reflective conductive film described herein is suitable for use as a reflective conductive layer in the manufacture of electronic devices, particularly flexible electronic devices, including electronic, photonic and optical assemblies or structures. The term "electronic device" as used herein refers to a device which contains as essential features at least a polymeric substrate and electronic circuitry. Such electronic devices may comprise a conductive polymer. The term "electronic device" as used herein includes an opto-electronic device, and such opto-electronic devices are a particular focus of the present invention. As used herein, the term "opto-electronic device" is a device which may source, detect and/or control light, and which acts as an electrical-to-optical or optical-to-electrical transducer, and includes instruments which use such devices in their operation, and in this context, the term "light" refers particularly to electromagnetic radiation in the visible spectrum, but also includes reference to electromagnetic radiation in the non-visible spectrum, including ultraviolet and infra-red radiation.

Preferably, the electronic device is selected from:
(i) Electronic display devices including an electroluminescent (EL) device (particularly an organic light emitting display (OLED)), an electrophoretic display (e-paper), an electrochromic device, a liquid crystal display device (particularly including transflective LCD devices) or an electrowetting display device. Reference to an electronic display device includes reference to flexible and rollable electronic display devices.

(ii) Photovoltaic cells, for instance amorphous silicon (a-Si) cells;
(iii) Light irradiation devices and decorative illumination devices, for instance, devices containing light-emitting elements such as light-emitting diodes and semiconductor lasers;
(iv) Electromagnetic radiation shield devices; and
(v) Any device which requires a reflective electrode.

The reflective conductive film of the present invention may find particular use in the manufacture of amorphous silicon (a-Si) cells.

In one embodiment, the term "electroluminescent display device", and particularly the term "organic light emitting display (OLED) device", as used herein refers to a display device comprising a layer of light-emitting electroluminescent material (particularly a conductive polymeric material) disposed between two layers each of which comprises an electrode, wherein the resultant composite structure is disposed between two substrate (or support or cover) layers. In one embodiment, the term "photovoltaic cell" as used herein refers to a device comprising a layer of conductive polymeric material disposed between two layers each of which comprises an electrode, wherein the resultant composite structure is disposed between two substrate (or support or cover) layers.

Thus, according to a further aspect of the invention, there is provided an electronic device, particularly a flexible electronic device, comprising a reflective conductive film as defined herein.

Property Measurement

The following analyses were used to characterize the films described herein:

(i) Reflectance at 540 nm was measured using a BYK Gardner Color-View 9000 spectrophotometer (a 35-channel 45°/0° spectrometer operating between 380 and 720 nm and collecting data every 10 nm; band pass=10 nm; polychromator=concave holographic grating). The light source consists of a tungsten-halogen lamp operating at a correlated colour temperature of approximately 2854 K. The operating lamp approximates CIE Standard Illuminant A. Illumination (circumferential) of the sample is carried out at 45° to the plane of the sample, and viewing/detection of the reflected light is carried out at in a direction perpendicular to the plane of the sample. The specular component of reflectance is excluded. The sample was placed on the reflectance port, with the face to be measured contacting the covering port. A backing tile is placed over the sample to ensure the sample is kept flat and an average of four measurements was taken. The backing tile has the following coordinates: L*=93.89, a*=0.09, b*=3.56, YI=5.52, WI=66.24, x=83.39, y=85.01, z=94.86. Thus, reflectance as targeted, defined and measured herein is primarily diffuse, rather than specular, reflectance, and in particular it is the reflectance measured perpendicular to a surface of light of wavelength 540 nm which is incident at 45° to said surface.

(iii) Sheet resistance (ohms/square or Ω/sq) of the conductive layer was measured using a linear four point probe (Jandel Model RM2) according to ASTM F390-98 (2003).

(iv) Thermal shrinkage was assessed for film samples of dimensions 200 mm×10 mm which were cut in specific directions relative to the machine and transverse directions of the film and marked for visual measurement. The longer dimension of the sample (i.e. the 200 mm dimension) corresponds to the film direction for which shrinkage is being tested, i.e. for the assessment of shrinkage in the machine direction, the 200 mm dimension of the test sample is oriented along the machine direction of the film. After heating the specimen to the predetermined temperature (by placing in a heated oven at that temperature) and holding for an interval of 30 minutes, it was cooled to room temperature and its dimensions re-measured manually. The thermal shrinkage was calculated and expressed as a percentage of the original length.

(v) Heat-seal strength to itself of a surface of the substrate (including the heat-sealable or binding layers) is measured in an Instron Model 4301 by positioning together the surfaces of two 25 mm wide samples of polyester film and heating the laminate structure at 190° C. for two seconds under a pressure of 0.1 MPa. The sealed film is cooled to room temperature, and the heat-seal strength determined by measuring the force required under linear tension per unit width of seal to peel the layers of the film apart at a constant speed of 4.23 mm/second. It will be appreciated that the heat-seal strength is provided by, and is a property of, the polymeric material of the substrate surface and is measured as such in the absence of nanowires. Thus, in the case of off-line nanowire application as described herein, heat-seal strength is measured on the substrate prior to application of the nanowires. In the case of in-line nanowire application as described herein, heat-seal strength is typically measured on the substrate of the finished film (i.e. post-stenter) during the film production run but before or after (but normally before) application of the nanowires, for instance during the quality-control phase at the start of a polyester film manufacturing run.

(vi) Softening temperature is measured by assessing the heat-seal strength to itself of a layer in the substrate to itself over a range of temperatures, typically 80 to 200° C. The softening temperature is the minimum temperature at which the heat-seal strength is equal to or higher than 100 g/25 mm. The heat-seal strength is measured as described hereinabove, but with variation of the sealing temperature. It will be appreciated that the term "the polymeric material of the base (or binding) layer has a softening temperature $T_s$", refers to the softening temperature of said polymeric material when in the form of said layer in said substrate.

(vii) Abrasion resistance of the composite film was evaluated using a Crockmeter from Atlas Electric Devices Co. After 50 crocks (one "crock" is one forward and one backward rub with a 2×2 cm$^2$ dry cloth) the film surface was inspected visually and graded with a grade of 1 to 5, where grade 1 corresponds to no visible scratching of the conductive surface, grade 2 corresponds to up to about 20% visible scratching, grade 3 corresponds to up to about 50% visible scratching, grade 4 corresponds to up to about 80% visible scratching and grade 5 corresponds to at least about 81% scratching, all respective to the conductive layer. The abrasion resistance test is a particularly harsh test designed to assess the performance of the film at extremes not normally experienced in the potential end-use. It will therefore be appreciated that a high percentage of scratching doesn't necessarily preclude a given film from commercial utility.

(viii) Adhesion of the nanowires to the substrate was evaluated using 4104-grade tape from Tesa (2.5 cm wide), either alone or with a cross-hatch tool. The Tesa tape was applied to the surface of the film sample at room temperature and a spatula was used to smooth down the tape, ensuring good contact with the film. The tape was then removed using a fast pull by hand. The results of the tape-alone adhesion were recorded as either "pass" (i.e. no coating removed) or "fail" (i.e. some or all coating removed). The results of the cross-hatch adhesion test were recorded as a percentage of the nanowire network retained on the surface. Films according to the invention exhibit a retention level of at least 90%, preferably at least 95%, preferably at 99% and preferably substantially complete retention.

(ix) The degree of crystallinity (DOC) of a polymer sample is the fractional amount of crystallinity in a polymer sample, and relies on the assumption that the sample can be sub-divided into a crystalline phase and an amorphous phase (the Two-Phase Model) wherein each phase has properties identical with those of their ideal states, with no influence of interfaces. The degree of crystallinity of a polyester resin can be measured via measurement of density, and applying the following relationship:

$$V_c = (P - P_a) \cdot (P_c - P_a)^{-1}$$

wherein $V_c$=volume fraction crystallinity; P=density of sample; $P_a$=density of amorphous material; and $P_c$=density of crystalline material. The density P can be measured in a density column, for instance using n-heptane/carbon tetrachloride mixtures.

The invention is further illustrated by the following examples. The examples are not intended to limit the invention as described above. Modification of detail may be made without departing from the scope of the invention.

EXAMPLES

Example 1

A composite film comprising a base layer of a copolyester of a reflective PET (12% $TiO_2$) and a heat-sealable (binding) layer comprising a copolyester of terephthalic acid/isophthalic acid/ethylene glycol/PEG (82/18/88/12 molar ratio; PEG molecular weight was 400 g/mol) was prepared by coextrusion. The polymer layers were coextuded using separate streams supplied from separate extruders, to a single channel coextrusion assembly. The polymer layers were extruded through a film-forming die on to a water-cooled rotating, quenching drum at various line speeds to yield an amorphous cast composite extrudate. The cast extrudate was heated to a temperature in the range of about 50 to 80° C. and then stretched longitudinally at a forward draw ratio of about 3:1. The polymeric film was passed into a stenter oven at a temperature of about 100° C., where the sheet was stretched in the sideways direction to approximately 3 times its original dimensions, and then heat-set at temperatures between 190 and 210° C. for about 1 minute. The heat-set film was then quenched rapidly in air at a temperature of about 25° C. The total thickness of the final film was 200 μm. The amorphous heat-sealable layer was approximately 20 μm thick, and exhibited a degree of crystallinity of less than about 5%. The semi-crystalline base layer exhibited a degree of crystallinity of about 35%. The polymeric material of the heat-sealable layer exhibited a softening temperature of about 176° C. The polymeric material of the base layer exhibited a melting point of about 250° C. The film had a reflectance value at 540 nm of 84.6%. The heat-seal strength to itself of the binding layer of the film was about 821 g/25 mm.

The film was then coated on its heat-sealable surface (i.e. on the binding layer) with an aqueous dispersion of silver nanowires (approximately 0.2 wt % silver) which had been filtered through a 75 μm mesh. The coating was performed using a No. 4 Meyer bar, to apply a layer having a wet-coat thickness of about 36 μm. Subsequently, samples of the coated film were dried at various temperatures (180, 200 and 220° C.) for either 30 or 60 seconds. The characteristics of the film were measured as described herein and the results presented in Table 1 below.

Comparative Example 1

A polymer composition for a reflective PET film comprising 18% $BaSO_4$ was extruded and cast onto a cooled rotating drum and stretched in the direction of extrusion to approximately 3 times its original dimensions. The film was passed into a stenter oven at a temperature of 100° C. where the film was stretched in the sideways direction to approximately 3 times its original dimensions. The biaxially stretched film was heat-set at about 230° C. by conventional means. The total thickness of the final film was 125 μm. The film exhibited a reflectance value of 84.1%. The semi-crystalline PET layer exhibited a degree of crystallinity of about 45%, and a melting point of about 250° C. The film was non-heat-sealable. Samples of the film were coated with silver nanowires and dried, in the same way as for Example 1. The characterising data are in Table 1.

TABLE 1

| Sample | Temp (° C.) | Time (s) | SR (Ω/sq) | Reflectance at 540 nm (%) | Adhesion (tape) (Pass/Fail) | Adhesion (cross-hatch) (%) | Abrasion (1-5) |
| --- | --- | --- | --- | --- | --- | --- | --- |
| C. Ex. 1 | 180 | 30 | 28 | 71.8 | Fail | 4 | 5 |
| C. Ex. 1 | 180 | 60 | 6 | 73.0 | Fail | 28 | 5 |
| Ex. 1 | 180 | 30 | 31 | 76.4 | Pass | 100 | 5 |
| Ex. 1 | 180 | 60 | 13 | 73.9 | Pass | 100 | 3 |
| C. Ex. 1 | 200 | 30 | 56 | 71.9 | Fail | 0 | 5 |
| C. Ex. 1 | 200 | 60 | 51 | 73.1 | Fail | 20 | 5 |
| Ex. 1 | 200 | 30 | 24 | 76.3 | Pass | 100 | 4 |
| Ex. 1 | 200 | 60 | 10 | 72.6 | Pass | 100 | 3 |
| C. Ex. 1 | 220 | 30 | 66 | 72.9 | Fail | 50 | 5 |
| C. Ex. 1 | 220 | 60 | 26 | 71.6 | Fail | 80 | 5 |
| Ex. 1 | 220 | 30 | 11 | 74.7 | Pass | 100 | 2 |
| Ex. 1 | 220 | 60 | 12 | 72.8 | Pass | 100 | 2 |

The experiments show that the non-heat-sealable PET film exhibited poor performance in the adhesion test, whereas the heat-sealable film exhibited excellent results. Good abrasion resistance was obtained for heat-sealable film samples dried at 220° C. Conversely, good abrasion resistance could not be obtained with the non heat-sealable films.

Control Example 1

A composite film comprising a base layer of a copolyester of a reflective PET (12% TiO$_2$) and a heat-sealable (binding) layer comprising a copolyester of terephthalic acid/isophthalic acid/ethylene glycol/PEG (82/18/88/12 molar ratio; PEG molecular weight was 400 g/mol) was prepared by coextrusion. The polymer layers were coextuded using separate streams supplied from separate extruders, to a single channel coextrusion assembly. The polymer layers were extruded through a film-forming die on to a water-cooled rotating, quenching drum at various line speeds to yield an amorphous cast composite extrudate. The cast extrudate was heated to a temperature in the range of about 50 to 80° C. and then stretched longitudinally at a forward draw ratio of about 3:1. The polymeric film was passed into a stenter oven at a temperature of about 100° C., where the sheet was stretched in the sideways direction to approximately 3 times its original dimensions, and then heat-set at temperatures between 190 and 210° C. for about 1 minute. The heat-set film was then quenched rapidly in air at a temperature of about 25° C. The total thickness of the final film was 200 µm. The amorphous heat-sealable layer was approximately 20 µm thick, and exhibited a degree of crystallinity of less than about 5%. The semi-crystalline base layer exhibited a degree of crystallinity of about 35%. The polymeric material of the heat-sealable layer exhibited a softening temperature of about 176° C. The polymeric material of the base layer exhibited a melting point of about 250° C. The film had a reflectance value at 540 nm of 84.6%. The heat-seal strength to itself of the binding layer of the film was about 821 g/25 mm.

Example 2

The procedure of Control Example 1 was repeated except that the film was in-line coated on its heat-sealable surface with an aqueous dispersion of silver nanowires (approximately 0.2 wt % silver) which had been filtered through a 75 µm mesh. The coating step was effected after the film was stretched longitudinally and before it was passed into the stenter oven. The coating was applied at a wet coat weight between 36 and 100 µm. The characteristics of the film were measured as described herein and the results presented in Table 2 below.

TABLE 2

| Sample | Wet Coat (µm) | SR (Ω/sq) | Reflectance at 540 nm (%) | Adhesion (tape) (Pass/Fail) | Adhesion (cross-hatch) (%) |
|---|---|---|---|---|---|
| Ex. 2-i | 36 | 500 | 84 | Pass | 100 |
| Ex. 2-ii | 50 | 100 | 80 | Pass | 100 |
| Ex. 2-iii | 60 | 80 | 76 | Pass | 100 |
| Ex. 2-iv | 100 | 20 | 72 | Pass | 100 |

The invention claimed is:

1. A process for the manufacture of a reflective conductive film comprising:
   (i) a reflective polymeric substrate comprising a polymeric base layer and a polymeric binding layer, wherein the polymeric material of the base layer has a softening temperature $T_{S-B}$, and the polymeric material of the binding layer has a softening temperature $T_{S-HS}$; and
   (ii) a conductive layer comprising a plurality of nanowires,
   wherein said nanowires are bound by the polymeric matrix of the binding layer such that the nanowires are dispersed at least partially in the polymeric matrix of the binding layer, said process comprising the steps of providing the reflective polymeric substrate comprising a polymeric base layer and a polymeric binding layer; disposing said nanowires on the exposed surface of the binding layer; and heating the resulting composite film to a temperature $T_1$ wherein $T_1$ is equal to or greater than $T_{S-HS}$, and $T_1$ is at least about 5° C. below $T_{S-B}$.

2. The process according to claim 1 wherein said nanowires are disposed on the exposed surface of the binding layer by dispersing said nanowires in a liquid vehicle and coating the nanowire-containing liquid onto the exposed surface of the binding layer.

3. The process according to claim 1 wherein the reflective polymeric substrate exhibits a reflectance at 540 nm of at least 80%.

4. The process according to claim 1 wherein the reflective conductive film exhibits a reflectance at 540 nm of at least 60%.

5. The process according to claim 1 wherein the reflective polymeric substrate is a polyester substrate.

6. The process according to claim 1 wherein the polymer of the base layer is selected from poly(ethylene terephthalate) and poly(ethylene 2,6-naphthalate).

7. The process according to claim 1 wherein the binding layer is a copolyester.

8. The process according to claim 7 wherein the copolyester is selected from:
   (i) a copolyester derived from ethylene glycol, terephthalic acid and isophthalic acid;
   (ii) a copolyester derived from terephthalic acid, an aliphatic dicarboxylic acid and a glycol; and
   (iii) a copolyester derived from terephthalic acid, ethylene glycol and 1,4-cyclohexanedimethanol.

9. The process according to claim 8 wherein the copolyester is a copolyester derived from ethylene glycol, terephthalic acid and isophthalic acid which exhibits a molar ratio of the terephthalic acid component to the isophthalic acid component in the range from 25:75 to 85:15.

10. The process according to claim 8 wherein the copolyester is a copolyester derived from terephthalic acid, an aliphatic dicarboxylic acid and ethylene glycol which exhibits a molar ratio of the terephthalic acid component to the aliphatic dicarboxylic acid component about 50:50 to about 70:30.

11. The process according to claim 8 wherein the copolyester is derived from terephthalic acid, azelaic acid and ethylene glycol.

12. The process according to claim 1 wherein the binding layer and base layer are coextruded.

13. The process according to claim 1 wherein the total thickness of the substrate is no more than 350 µm.

14. The process according to claim 1 wherein the polymeric substrate comprises one or more reflecting agent(s)

selected from particulate inorganic filler(s), incompatible resin filler(s) and mixtures thereof, wherein the amount of reflecting agent incorporated into the substrate is in the range of from 5% to 60% by weight, based on the weight of the polymeric material of a given layer.

15. The process according to claim 1 wherein the polymeric substrate comprises a reflecting agent selected from titanium dioxide, barium sulphate and mixtures thereof.

16. The process according to claim 1 wherein the sheet resistance of the reflective conductive film is less than 100,000 ohms per square.

17. The process according to claim 1 wherein the nanowires are metal nanowires, and in one embodiment wherein the nanowires are silver nanowires.

18. The process according to claim 1 wherein the nanowires are carbon nanotubes.

19. The process according to claim 1 wherein said step of providing the reflective polymeric substrate comprises a substrate manufacturing process which comprises the steps of extruding a layer of molten polymer, quenching the extrudate and orienting the quenched extrudate in at least one direction, and wherein the conductive layer is applied to the surface of the binding layer of the substrate after the substrate manufacturing process has been completed, wherein following deposition of the nanowires, the substrate is heated to temperature $T_1$.

20. The process according to claim 1 wherein said step of providing the reflective polymeric substrate comprises a substrate manufacturing process which comprises the steps of extruding a layer of molten polymer, quenching the extrudate and orienting the quenched extrudate in at least one direction, and wherein the conductive layer is applied to the surface of the binding layer of the substrate during the substrate manufacturing process, wherein following deposition of the nanowires, the substrate is heated to temperature $T_1$.

21. The process according to claim 20 wherein the substrate manufacturing process includes a heat-setting step and wherein the conductive layer is applied to the surface of the binding layer of the substrate prior to the heat-setting step.

22. The process according to claim 21 wherein the substrate manufacturing process comprises a two-stage (longitudinal and transverse) biaxial stretching step and wherein the conductive layer is applied to the surface of the binding layer of the substrate between the longitudinal and transverse stages.

23. The process according to claim 1 wherein the heating temperature $T_1$ is in the range of from about 50° C. to about 240° C.

24. A process for the manufacture of a reflective conductive film, comprising providing a reflective polymeric substrate comprising a polymeric base layer and a polymeric binding layer, and disposing a conductive layer comprising a plurality of nanowires on an exposed surface of the binding layer, wherein the polymeric material of the base layer has a softening temperature $T_{S-B}$, and the polymeric material of the binding layer has a softening temperature $T_{S-HS}$, wherein the polymeric substrate is a biaxially oriented polyester substrate, wherein the polymeric binding layer is a copolyester, wherein the polymer of the base layer is selected from poly(ethylene terephthalate) and poly(ethylene 2,6-naphthalate).

25. The process according to claim 1 wherein said binding layer is a heat-sealable layer.

26. A process for the manufacture of a reflective conductive film, comprising providing a reflective polymeric substrate comprising a polymeric base layer and a polymeric binding layer, and disposing a conductive layer comprising a plurality of nanowires on an exposed surface of the binding layer, wherein the polymeric material of the base layer has a softening temperature $T_{S-B}$, and the polymeric material of the binding layer has a softening temperature $T_{S-HS}$, wherein the polymeric substrate is a biaxially oriented polyester substrate, wherein the polymeric binding layer is a copolyester, wherein the binding layer is a copolyester selected from:
  (i) a copolyester derived from ethylene glycol, terephthalic acid and isophthalic acid;
  (ii) a copolyester derived from terephthalic acid, an aliphatic dicarboxylic acid and a glycol; and
  (iii) a copolyester derived from terephthalic acid, ethylene glycol and 1,4-cyclohexanedimethanol.

27. The process according to claim 1 wherein the reflective polymeric substrate is a biaxially oriented substrate.

* * * * *